United States Patent [19]

Kawata

[11] Patent Number: 4,987,537
[45] Date of Patent: Jan. 22, 1991

[54] COMPUTER CAPABLE OF ACCESSING A MEMORY BY SUPPLYING AN ADDRESS HAVING A LENGTH SHORTER THAN THAT OF A REQUIRED ADDRESS FOR THE MEMORY

[75] Inventor: Kazuhide Kawata, Tokyo, Japan

[73] Assignee: NEC Corporation, Tokyo, Japan

[21] Appl. No.: 200,207

[22] Filed: May 31, 1988

[30] Foreign Application Priority Data

May 31, 1987 [JP] Japan ............... 62-137489

[51] Int. Cl.⁵ ............................................. G06F 12/02
[52] U.S. Cl. .................... 364/200; 364/252.3
[58] Field of Search ... 364/200 MS File, 900 MS File

[56] References Cited

U.S. PATENT DOCUMENTS

| | | | |
|---|---|---|---|
| 4,340,932 | 7/1982 | Bakula et al. | 364/200 |
| 4,485,457 | 11/1984 | Balaska et al. | 364/900 |
| 4,500,961 | 2/1985 | Engles | 364/200 |
| 4,592,011 | 5/1986 | Mantellina et al. | 364/900 |
| 4,831,522 | 5/1989 | Henderson et al. | 364/200 |

Primary Examiner—Raulfe B. Zache
Attorney, Agent, or Firm—Foley & Lardner, Schwartz, Jeffery, Schwaab, Mack, Blumenthal & Evans

[57] ABSTRACT

A computer comprises an instruction memory storing therein instruction codes and including a plurality of divided address spaces, and a CPU receiving an instruction read out of the instruction memory for executing the read-out instruction and outputting an address data for an instruction code to be next executed to the instruction memory. In addition, there is provided a space code memory storing respective codes indicative of the divided address spaces within the instruction memory for respective instruction codes stored in the instruction memory, for generating an address space code for an instruction to be executed next to an instruction code designated by the address given to the instruction memory. A flipflop is provided to latch the address space code generated by the space code memory so as to supply the latched address space code to the instruction memory after one instruction execution time, so that the instruction memory is address-designated by a combination of the address data outputted from the CPU and the address space code delayed by the flipflop.

4 Claims, 4 Drawing Sheets

COMPUTER CAPABLE OF ACCESSING A MEMORY BY SUPPLYING AN ADDRESS HAVING A LENGTH SHORTER THAN THAT OF A REQUIRED ADDRESS FOR THE MEMORY

BACKGROUND OF THE INVENTION

1. Field of the invention

The present invention relates to a computer, and more specifically to a computer capable of executing a program of the volume larger than the address space of a memory which can be normally address-designated by a central processing unit.

2. Description of related art

Hitherto, a so-called "bank-switched system" has been adopted for executing a program in volume larger than an address space which can be normally designed by a central processing unit (called "CPU" hereinafter). This system is realized by using a flipflop and the like for giving an additional address portion in place higher than an address given by a so-called program counter associated to the CPU.

For example, referring to FIG. 1, there is one example of a conventional system in which an address space is extended. In the shown system, a CPU 1 can only ouput an address of n bits $A_1$ to $A_n$ to a memory 2, but a flipflop circuit 3 provided in addition to the CPU 1 outputs an address signal $A_{n+1}$ to the memory 2. Thus, an address space which can be accessed by the CPU 1 will substantially extended by the amount which can be designated by the flipflop circuit 3. In the example shown in FIG. 1, since the flipflop circuit 3 is assumed to give one bit, if the content of the flipflop circuit 3 can be set and reset, the address space which can be accessed by the CPU 1 is doubled in comparison with the case having no flipflop circuit 3. Namely, the address space is extended from the size designated by the address of $A_1$ to $A_n$ to the size designated by the address of $A_1$ to $A_{n+1}$.

In general, there are two methods for handling the flipflop circuit 3. A first method is to use an input/output instruction for the CPU. A second method is called "memory mapped I/O".

In the first method, one of addresses for input/output instructions is allocated to the flipflop circuit 3. In the second method, on the other hand, the memory address space accessible by the CPU is divided into two address space portions, i.e., an normally accessible address space before memory space extension and an extended address space, and different conditions of the flipflop are allocated to the two address space portions. In addition, the content of the flipflop is controlled by respective operation instructions. Thus, the address space is switched. These address space portions to be switched are called "banks".

In the bank-switched system mentioned above, at least one instruction is required for switching the banks. Accordingly, in the case of instructions such as a subroutine call, a return, and a jump instruction, which have to frequently branch from one bank to another, bank switching instructions will frequently appear, with the result that the address space for programs will correspondingly be restricted and the execution time of programs will be increased.

SUMMARY OF THE INVENTION

Accordingly, it is an object of the present invention to provide a computer which has overcome the above mentioned defect of the conventional one.

Another object of the present invention is to provide a computer capable of shortening the length of a program and of preventing the increase of the program execution time, even when there is executed a program including a number of branches of one bank to another.

The above and other objects of the present invention are achieved in accordance with the present invention by a computer comprising an instruction memory storing therein instruction codes and including a plurality of divided address spaces, a CPU receiving an instruction read out of the instruction memory for executing the read-out instruction and outputting an address data for an instruction code to be next executed to the instruction memory, a space code memory storing respective codes indicative of the divided address spaces within the instruction memory for respective instruction codes stored in the instruction memory, for generating an address space code for an instruction to be executed next to an instruction code designated by the address given to the instruction memory, and a delay means for delaying the address space code generated by the space code memory by one instruction execution time so as to supply the delayed address space code to the instruction memory, so that the instruction memory is address-designated by a combination of the address data outputted from the CPU and the address space code delayed by the delay means.

With the above mentioned arrangement, the space code memory outputs a code of one divided address space in the instruction memory for storing an instruction code to be executed in the next execution cycle, and the address space code outputted from the space code memory is delayed by the delay means, and combined with the address data outputted from the CPU to produce an address of the instruction memory storing the instruction code to be next executed. Therefore, when the CPU accesses an extended address space, there is not required any additional instruction (an instruction for bank switching) other than an originally required instruction. Therefore, utility efficiency of the memory can be increased and also the execution time of programs can be shortened.

In a preferred embodiment, the space code memory stores an memory address space code for each instruction code at the same address as the address of the instruction memory storing an instruction code to be executed just before above mentioned each instruction code, so that, when the same address "X" is applied to the instruction memory and the space code memory, the instruction memory reads out an instruction "Y" stored at the address "X" within the instruction memory, and the space code memory reads a space code stored at the address "X" within the space code memory, the read-out space code being indicative of an address space within the instruction memory including an address "X+1" storing an instruction "Y+1" to be executed next to the instruction "Y" stored at the addressd "X".

Further, the delay means includes a flipflop having a D input connected to receive the space code signal from the space code memory and an Q output connected to the address input of the instruction memory and the space code memory, the flipflop responding to a clock so as to latch the space code signal from the space code memory.

In addition, each of the clock is adapted to have already assumed a high level when each of instruction cycles starts, and then to be brought to a low level around a middle of each instruction cycle, and then returned to the high level sufficiently before an end of each instruction cycle, so that at the rising edge of each clock, the flipflop latches the space code signal outputted from the space code memory and on the other hand, the CPU is adapted to execute an instruction given at the start of each cycle.

The above and other objects, features and advantages of the present invention will be apparent from the following description of preferred embodiments of the invention with reference to the accompanying drawings.

DESCRIPTION OF THE PREFERRED EMBODIMENTS

Figure 1:
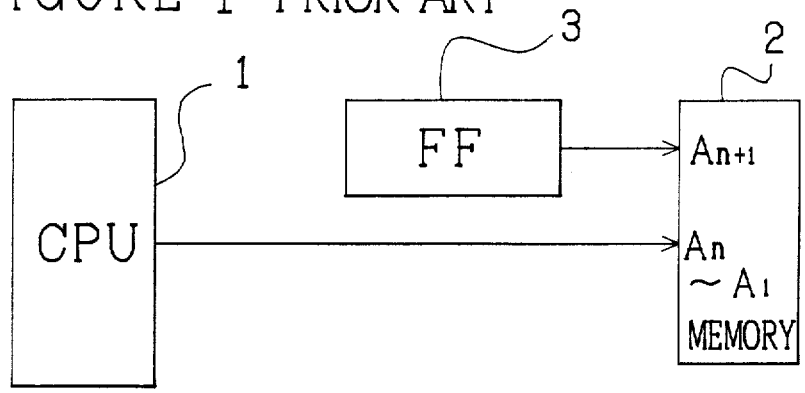
FIG. 1 is a block diagram illustrating the principle of the conventional bank switched system.
Figure 2:
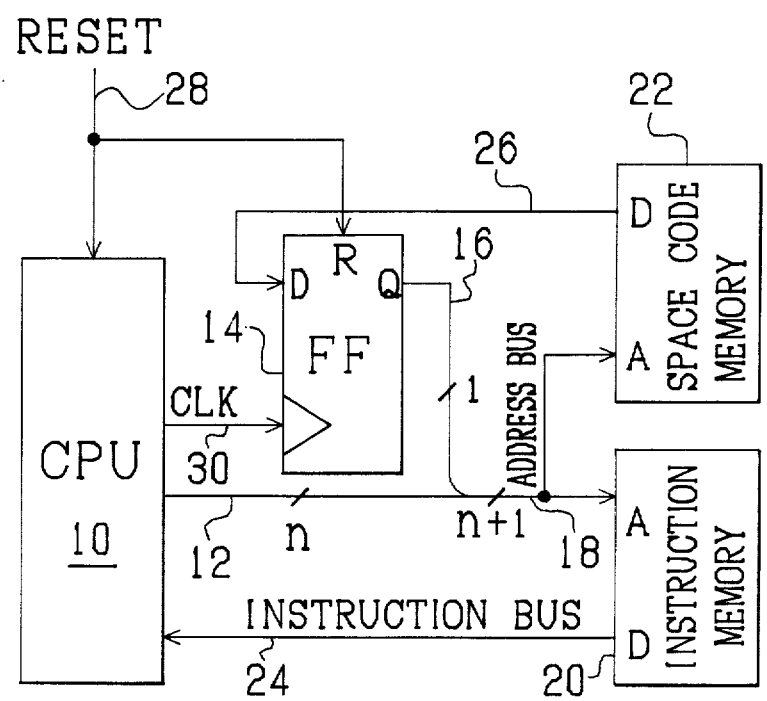
FIG. 2 is a block diagram of one embodiment of the computer in accordance with the present invention.

Referring to FIG. 2, there is shown a diagram of one embodiment of the computer in accordance with the present invention, which includes a CPU 10 generating an address data 12 of n bits in a low place and a flipflop 14 outputting from its Q output a delayed space (or bank) code signal 16 of one bit in a high place. The address data 12 and the delayed space code signal 16 are combined and sent through a real address bus 18 of (n+1) bits to respective address inputs "A" of an instruction memory 20 and a space code memory 22. A data output "D" of the instruction memory 20 is coupled through an instruction bus 24 to the CPU 10. On the other hand, the space code memory 22 outputs a space code signal 26 from its data output "D" to a D input of the flipflop 14. In addition, the CPU 10 and the flipflop 14 are connected to receive a reset signal 28, RESET, and the flipflop 14 also receives an instruction execution timing clock 30 outputted from the CPU 1. In addition to the above mentioned components, the computer comprises other components not shown but well known to persons skilled in art, however, explanation thereof will be omitted for simplification of the drawings and explanation.

When the flipflop 14 is reset by the reset signal 28, the flipflop 14 will output a signal of "0" form its Q output, and when the timing clock 30 is applied to the flipflop 14, the flipflop 14 will latch the output 26 of the space code memory 22 so that the flipflop 14 outputs the latched content from the Q output during the period of one execution cycle.

The instruction memory 20 operates to read an instruction stored at an address designated by the content of the real address bus 18, and to output the read-out instruction through the instruction bus 24 to the CPU 10, so that the CPU will execute the received instruction. On the other hand, the space code memory 20 stores all codes indicative of respective address spaces (segments or banks) divided in the instruction memory 20. In general, programs are generally formed of a sequence of instructions whose addresses are successively incremented from a start to an end of the instruction sequence. Therefore, if one address for an instruction is given, an instruction to be executed next to the given instruction, and hence an address for the next instruction will be forecasted. On the basis of this forecast property of instructions, the space code memory 22 stores an memory address space code for each instruction code at the same address as the address of the instruction memory storing an instruction code to be executed just before above mentioned each instruction code. Therefore, when the same address "X" is applied from the address bus 18 to the instruction memory 20 and the space code memory 22, the instruction memory 20 reads out an instruction "Y" stored at the address "X" within the instruction memory 20, and the space code memory 22 reads a space code stored at the address "X" within the space code memory 22. The read-out space code is indicative of an address space within the instruction memory 20 including an address "X+1" storing an instruction "Y+1" to be executed next to the instruction "Y" stored at the address "X".

Figure 3:
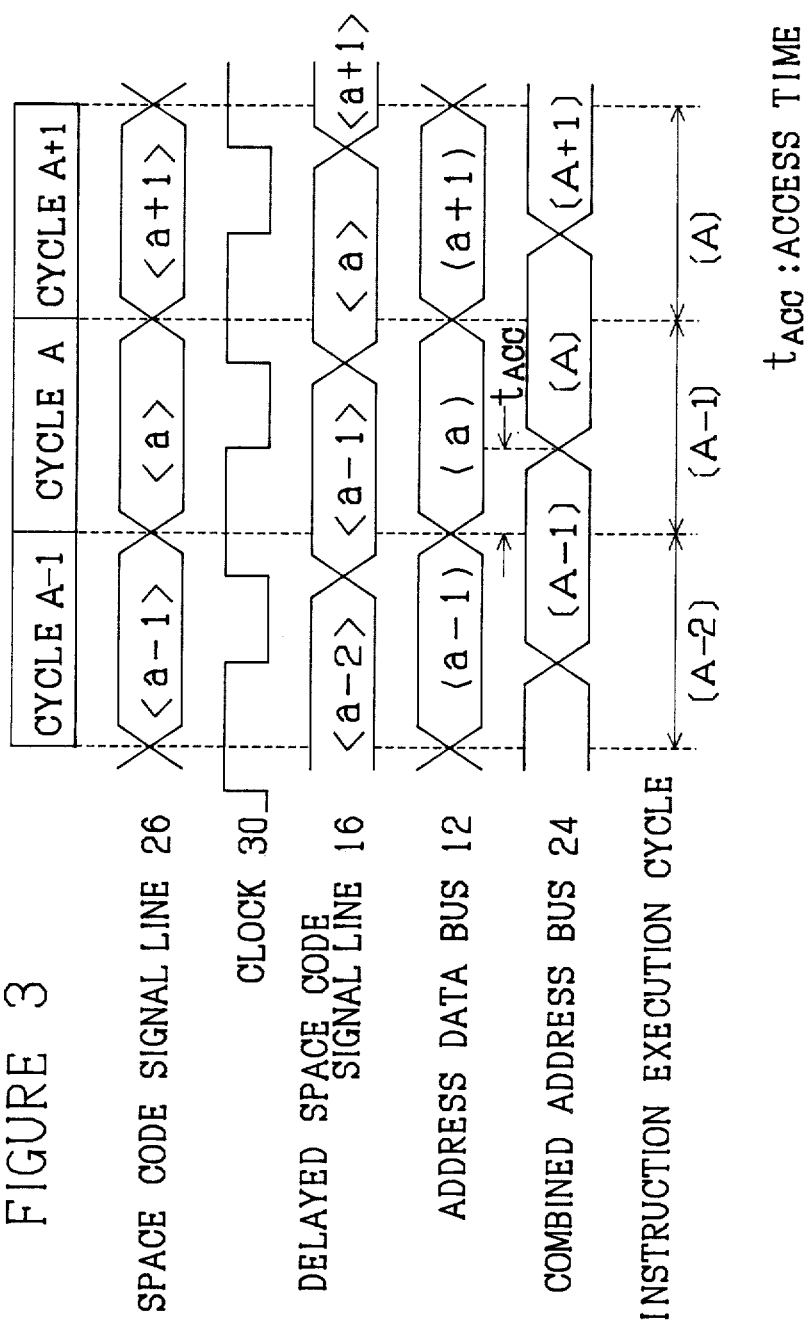
FIG. 3 is a timing chart illustrating an operation of the computer shown in FIG. 2.

Now, operation of the above mentioned computer will be described with reference to FIG. 3 showing a timing chart illustrating the status of signals on the lines 26, 30 and 16 and the buses 12 and 18 shown in FIG. 2.

As seen from FIG. 3, when each of instruction cycles represented by "A−1", "A" and "A+1" starts, the clock 30 has already assumed a high level. Thereafter, the clock 30 is brought to a low level around a middle of each instruction cycle, and then returned to the high level sufficiently before an end of each instruction cycle. At the rising edge of each clock 30, the flipflop 14 latches the space code signal 26 outputted from the space code memory 22. Namely, the flipflop 14 updates its content in response to the rising edge of each clock 30. On the other hand, the instruction memory 20 outputs the read-out instruction in response to a falling edge of each clock 30. On the other hand, the CPU 10 is adapted to execute an instruction given on the instruction bus 24 at the start of each cycle.

Attention is paid to the execution cycle "A". During the period of the cycle "A", the CPU 10 executes the instruction [A−1], and outputs an address data (a) on the bus 12. Further, the space code memory 22 outputs a space code data <a> on the line 26. On the other hand, the flipflop 14 outputs a preceding space code <a−1> at the start of the cycle "A". As a result, During an access time $T_{ACC}$ from the start of the instruction cycle "A" to the moment the clock 30 falls down to the low level in the same instruction cycle "A", an address including the address data (a) on the bus 12 as a lower place address data and the space code <a−1> on the line 16 as the highest place address bit, is supplied through the address bus 18 to the instruction memory 20 and the space code memory 22. At the falling edge of the clock 30, the instruction memory 20 outputs an instruction [A] stored at the address "<a−1>+(a)" to the instruction bus 24. Thereafter, at the rising edge of the clock 30, the space code signal <a> on the line 26 is latched to the flipflop 14 so that content of the flipflop 14 is updated to the space code signal <a>. At this time, since the access time $t_{ACC}$ has already been completed, this updating of the flipflop 14 will not influence the output of the instruction memory 20. Further, after the execution cycle is change from the cycle "A" to "A+1", the CPU 10 outputs a next address data (a+1) onto the bus 12, and the space code memory 22 outputs a space code signal <a+1> for an instruction to be executed next to the instruction stored at the address "<a−1>+(a)" in the instruction memory 20. In addition, the CPU 10 will execute the instruction [A] in the period of the cycle "A+1".

As seen from the above, the space code signal <a> outputted from the space code memory 22 is outputted to the line 17 after it has been delayed by a length of time approximately corresponding to one execution cycle. Thus, the data outputted on the line 16 in the execution cycle "A" is one which has been outputted form the space code memory 22 during the execution cycle "A−1".

Now, assume that when the highest place bit of the address bus 18 (the Q output of the flipflop 14) is of "0", an extended memory space is designated, and when the highest place bit of the address bus 18 (the Q output of the flipflop 14) is of "1", a normally accessible memory space before extension is designated. Therefore, as seen from FIG. 3, the content of the space code memory 22 accessed in each execution cycle will designate the address space of an instruction to be next executed. For example, in the case shown in FIG. 3, if the content <a−1> is of "0", it means that the instruction [A] to be executed in the cycle "A+1" is stored at the address (a) within the normally accessible memory space before extension of memory space. On the other hand, if the content <a−1" is of "1", it means that the instruction [A] to be executed in the cycle "A+1" is stored at the address (a) within the extended memory space.

As seen form the above, the embodiment shown in FIG. 2 previously stores the address codes in the space code memory 22 but will need no special instruction for switching the address spaces. In addition, if the address code stored in the space code memory 22 is automatically generated by means of a language processing program such as "assembler", a load at the time of producing a program can be avoided.

Figure 4:
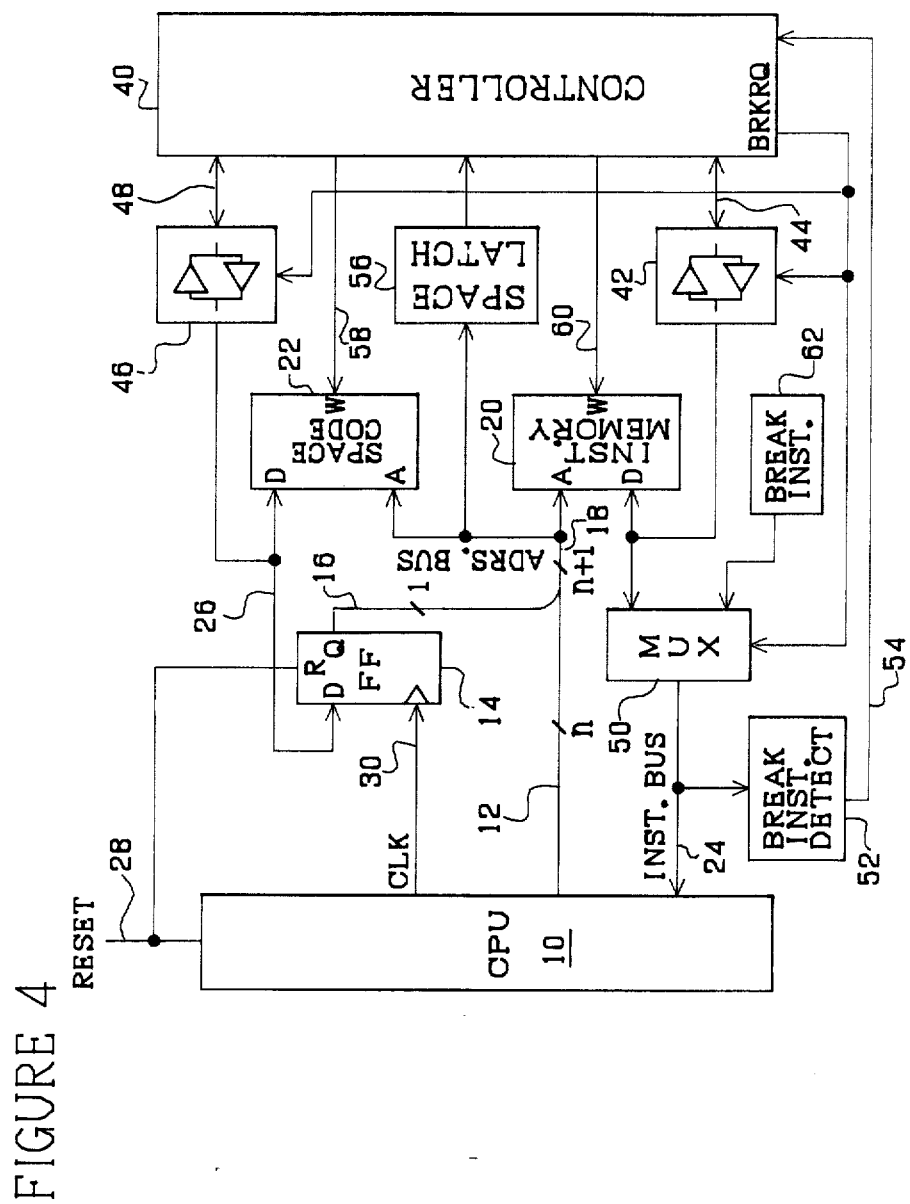
FIG. 4 is a block diagram illustrating an embodiment of the program debugger applied with the present invention.

Turning to FIG. 4, there is shown a block diagram of a program debugger embodying the present invention. In FIG. 4, elements similar to those shown in FIG. 2 are given the same Reference Numerals and explanation thereof will be omitted.

The shown program debugger includes a controlled 40 which can be composed of a conventional microprocessor. This controller 40 generates a break request signal BRKRQ for requesting an interrupt of the execution of the CPU 10. This signal BRKRQ is sent to a control terminal of a bidirectional tristate 42 which is in turn connected at its one end through an instruction memory write/read bus 44 to the controller 40 and at its other end to the instruction output D of the instruction memory 20. This signal BRKROQ is also applied to a control terminal of another bidirectional tristate 46 which is in turn connected at its one end through a space code memory write/read bus 48 to the controller 40 and at its other end to the space code output D of the space code memory 22. In addition, the signal BRKRQ is applied to a control terminal of a multiplexor 50 which has a first input connected to the instruction output D of the instruction memory 20 and a second input connected to an break instruction code generator 62. An output of the multiplexor 50 is connected to the instruction bus 24 which is connected to the CPU 10 and a break instruction detection circuit 52. This detection circuit 52 will generates a break instruction detection signal 54 to the controller 40.

The address bus 18 is coupled to an address latch 56 which is in turn coupled to the controller 40. In addition, the controller 40 outputs a space code memory write signal 58 to the space code memory 22 and an instruction memory write signal 60 to the instruction memory 20, respectively.

Now, if the signal BRKRQ is made active by the controller 40, the multiplexor 50 is changed to supply the instruction bus 24 with an output of the break instruction code generator 62, not the output of the instruction memory 20. In response to the break instruction code, the CPU 10 is brought into a break condition so as to put the address bus 12 in a high impedance condition and to suspend the updating of an internal program counter (not shown) functioning as an address generating source. On the other hand, the address data just before the CPU is put into the break condition, is latched in the address latch 56. In a known manner, the controller 40 reads the content of the address latch 56, and saves the content of the address latch 56 to an address save memory (not shown) in the controller 40. In addition, the controller 40 also save the content stored in the instruction memory 20 as well as the content of the space code memory 22 indicated by the content of the address latch 56, into an instruction save memory (not shown).

Thereafer, in accordance with a known manner, the controller 40 writes an instruction branching to a head of addresses in the instruction memory 20 for a series of instructions which are desired to be executed by the CPU 10, into the address in the instruction memory 20 indicated by the content of the address save memory. Incidentally, the series of instructions which are desired to be executed by the CPU 10 are ended with a break instruction.

Here, if the above mentioned series of instructions are in the extended address space, the controller 40 writes "1" into the address indicates by the content of the address save memory for the space code memory 22, in accordance with a known manner. If not so, namely, if the above mentioned series of instructions are in the normally accessible address space before extension, the controller 40 writes "0" into the address indicated by the content of the address save memory for the space code memory 22.

Thereafter, when the controller 40 makes the signal BRKRQ inactive, the CPU restarts the execution of the instructions. A firstly executed instruction is a branch to the above mentioned series of instructions. Further, since the above mentioned series of instructions are ended with a break instruction as explained hereinbefore, when the execution of the above mentioned series of instructions have been completed, the CPU is put in the break condition, again.

Whether or not the CPU is put in the break condition, is detected by the break detection circuit 52, and then informed to the controller 40. As a result, when the controller 40 causes the CPU 10 to restart the program which had been executed before the break and which is suspended as the result of the occurrence of the break, the controller 40 makes the signal BRKRQ active, and writes the content of the instruction save memory into the address of the instruction memory 20 indicated by the content of the address save memory and into the space code memory 22, respectively. Then, the break instruction positioned at the end of the series of instructions which have been executed under control of the controller 40 is replaced with an instruction branching to the address indicated by the content of the address save memory, and thereafter, the signal BRKRQ is returned to the inactive condition. With this, it restarts to execute a sequence of instructions which has been originally executed by the CPU 10.

In the above mentioned embodiment, if a sequence of instructions which has been originally executed by the CPU 10 is stored in the normally accessible memory space before extension, and if the instructions executed by the CPU 10 under control of the controller 40 in the break condition is stored in the extended memory space, it is possible to debug a program stored in the normally accessible memory space determined by the number of bits of the address data 12 outputted from the CPU 10 without leaving an empty memory area.

Figure 5:
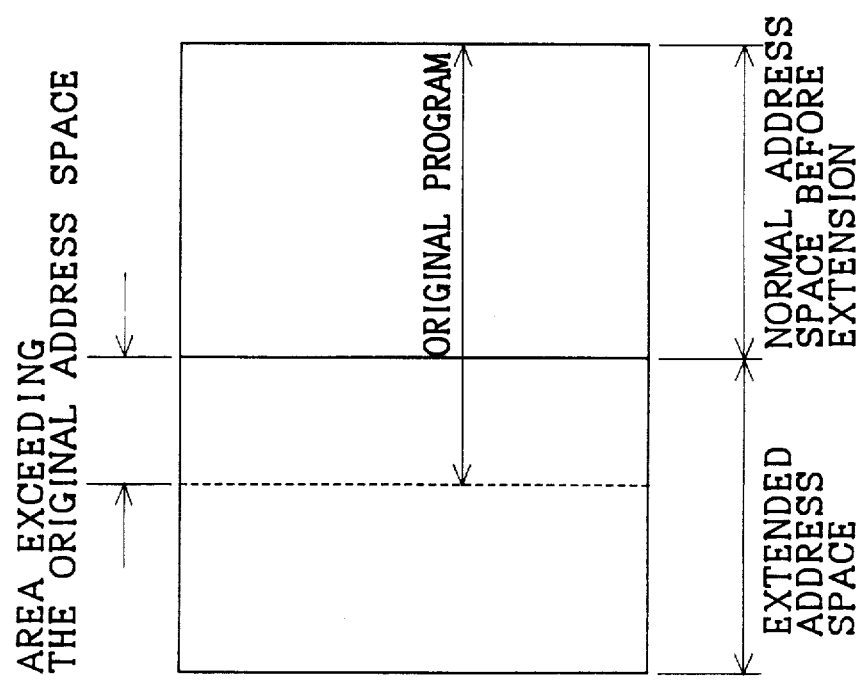
FIG. 5 illustrates an example of the division of a memory address space in the case that a program is debugged by the program debugger shown in FIG. 4.

Further, as shown in FIG. 5, even if the original program temporarily exceeds the normally accessible address space in the course of a program debugging operation, the exceeding portion of the program under debugging can be stored in the extended memory space. Therefore, the exceeding portion of the program under debugging can be executed at the same speed as that obtained when all the program under debugging is stored in the normally accessible address space before extension.

In the above mentioned embodiments, the space code memory 22 has been adapted to output the space code signal of one bit. But, the space code memory 22 can be adapted to output the space code signal of two or more bits.

As described above, since the computer in accordance with the present invention will require a program for switching the extended memory space, it is possible to execute at a high speed a program requiring an address space exceeding the address space normally accessible by the CPU. In addition, in order to switch different banks of memory, there is not used a memory address space normally accessible by the CPU or an address space for input/out instructions, differently from the conventional bank switched system. Therefore, it is possible to execute a program which needs all of the memory address space normally accessible by the CPU without leaving an empty area.

The invention has thus been shown and described with reference to the specific embodiments. However, it should be noted that the present invention is in no way limited to the details of the illustrated structures but changes and modifications may be made within the scope of the appended claims.

I claim:

1. A computer comprising an instruction memory storing therein instruction codes an having its entire memory region divided into a plurality of non-overlapping memory address spaces, a CPU receiving a received instruction code read out of said instruction memory for executing said received instruction code and outputting to said instruction memory address data for an instruction code to be executed next after said received instruction code, said address data being composed to designate one memory location included in each of said memory address spaces, a space code memory storing respective address space codes each indicative of one of said address spaces within said instruction memory, and delay means for delaying said address space code outputted by said space code memory by one instruction execution time to produce a delayed address space code, said delayed address space code being combined with said address data outputted by said CPU so as to form a complete address for accessing said instruction memory and said complete address being supplied to said instruction memory and said space code memory, so that an instruction code is read out to said CPU from a location of said instruction memory designated by said supplied complete address, and an address space code indicative of a memory address space including a memory location storing an instruction to be executed next after said read-out instruction code is read out from said space code memory so as to be outputted to said delay means.

2. The computer as claimed in claim 1 wherein said space code memory stores a memory address space code for each instruction code at an address corresponding to an address of said instruction memory storing an instruction code to be executed just before execution of said each instruction code, so that, when the same address "X" is applied from said CPU to said instruction memory and said space code memory, said instruction memory reads out an instruction "Y" stored at the address "X" within said instruction memory, and said space code memory reads a space code stored at the address "X" within said space code memory, said read-out space code being indicative of an address space within said instruction memory including an address "X+1" storing an instruction "Y+1" to be executed next to the instruction "Y" stored at the address "X".

3. The computer as claimed in claim 1 wherein said delay means includes a flipflop having a D input connected to receive a signal indicative of said address space code from said space code memory and a Q output connected to the address input of said instruction memory and space code memory, said flipflop responding to clock signals so as to latch said signal indicative of said address space code from said space code memory.

4. The computer as claim in claim 3 wherein said clock signals and instruction cycles are timed to each other such that each of said clock signals has already assumed a high level when each of instruction cycles starts, and then reaches a low level around a middle of each instruction cycle, and then returns to said high level sufficiently before an end of each instruction cycle, said CPU, said instruction memory, said space code memory, and said flipflop interacting so that at the rising edge of each clock signal, said flipflop latches said signal indicative of said address space code outputted from said space code memory, and at the falling edge of each clock signal, said instruction memory outputs an instruction code corresponding to said supplied complete address, and on the other hand, at the start of each instruction cycle, said CPU executes said instruction code outputted from said instruction memory and said space code memory outputs said address space code to said flipflop.

* * * * *